(12) United States Patent
Liao et al.

(10) Patent No.: US 10,939,573 B1
(45) Date of Patent: Mar. 2, 2021

(54) ELECTRONIC MODULE CARRIER FOR AN INFORMATION HANDLING SYSTEM

(71) Applicant: DELL PRODUCTS, L.P., Round Rock, TX (US)

(72) Inventors: Te-Ming Liao, Taoyuan (TW); Chun-Yang Tseng, Taipei (TW); Chih-Hsien Chang, Taipei (TW); Hsiang-Yin Hung, Taipei (TW); Raymond D. Heistand, II, Round Rock, TX (US)

(73) Assignee: Dell Products, L.P., Round Rock, TX (US)

(*) Notice: Subject to any disclaimer, the term of this patent is extended or adjusted under 35 U.S.C. 154(b) by 0 days.

(21) Appl. No.: 16/554,588

(22) Filed: Aug. 28, 2019

(51) Int. Cl.
| | |
|---|---|
| *H05K 7/00* | (2006.01) |
| *H05K 7/14* | (2006.01) |
| *H01R 13/629* | (2006.01) |
| *H01R 13/627* | (2006.01) |
| *H01R 12/73* | (2011.01) |

(52) U.S. Cl.
CPC ......... *H05K 7/1489* (2013.01); *H01R 12/737* (2013.01); *H01R 13/6275* (2013.01); *H01R 13/62983* (2013.01); *H05K 7/1487* (2013.01)

(58) Field of Classification Search
None
See application file for complete search history.

(56) References Cited

U.S. PATENT DOCUMENTS

| | | | | |
|---|---|---|---|---|
| 5,140,663 A | * | 8/1992 | Edwards | G02B 6/3869 385/139 |
| 5,277,615 A | * | 1/1994 | Hastings | G06F 1/181 361/679.32 |
| 5,340,340 A | * | 8/1994 | Hastings | G06F 1/181 312/223.1 |
| 5,673,171 A | * | 9/1997 | Varghese | G11B 33/08 248/615 |
| 5,673,172 A | * | 9/1997 | Hastings | G06F 1/182 361/679.34 |
| 6,201,692 B1 | * | 3/2001 | Gamble | G11B 33/126 361/679.31 |
| 6,238,026 B1 | * | 5/2001 | Adams | G06F 1/184 312/223.2 |
| 6,252,514 B1 | * | 6/2001 | Nolan | G06F 1/183 340/686.4 |
| 6,373,695 B1 | * | 4/2002 | Cheng | G06F 1/184 312/223.1 |

(Continued)

*Primary Examiner* — Anthony Q Edwards
*Assistant Examiner* — Rashen E Morrison
(74) *Attorney, Agent, or Firm* — Isidore PLLC

(57) ABSTRACT

An electronic module (EM) carrier includes a sliding bracket coupled to the EM carrier and a handle coupled to the sliding bracket. The handle and sliding bracket are configured to engage with a stationary chassis to hold the EM carrier at a first position in a bay of the stationary chassis when the handle is open. The sliding bracket is further configured to translate the EM carrier to a second position in the stationary chassis when the handle is moved from an open position towards a closed position. In the second position, an EM carrier connector of the EM carrier is engaged with a sled connector of a sled and, in the first position, the EM carrier connector is disengaged from the sled connector.

20 Claims, 17 Drawing Sheets

(56) References Cited

U.S. PATENT DOCUMENTS

| | | | | |
|---|---|---|---|---|
| 6,430,053 B1* | 8/2002 | Peterson | H01R 13/6335 | 361/728 |
| 6,456,489 B1* | 9/2002 | Davis | G06F 1/184 | 312/332.1 |
| 6,464,085 B1* | 10/2002 | Chin | G11B 33/128 | 211/26 |
| 6,616,106 B1* | 9/2003 | Dean | G06F 1/184 | 248/27.1 |
| 6,774,808 B1* | 8/2004 | Hibbs | G06F 1/184 | 340/686.4 |
| 6,978,903 B2* | 12/2005 | Son | G06F 1/184 | 211/26 |
| 7,052,306 B2* | 5/2006 | Ishigami | G02B 6/4201 | 439/372 |
| 7,090,523 B2* | 8/2006 | Shirk | G02B 6/4246 | 439/352 |
| 7,186,134 B2* | 3/2007 | Togami | G02B 6/4246 | 439/160 |
| 7,301,778 B1* | 11/2007 | Fang | H05K 7/1409 | 312/223.2 |
| 7,460,365 B2* | 12/2008 | Morris | G06F 1/187 | 361/679.33 |
| 7,513,693 B2* | 4/2009 | Wang | G02B 6/3897 | 385/56 |
| 7,523,901 B2* | 4/2009 | Wu | G11B 33/128 | 211/162 |
| 8,054,624 B2* | 11/2011 | Chen | G06F 1/187 | 361/679.37 |
| 8,054,638 B2* | 11/2011 | Graybill | H05K 7/1489 | 361/747 |
| 8,385,076 B2* | 2/2013 | Peng | H05K 7/1401 | 361/740 |
| 8,416,563 B2* | 4/2013 | Hou | H05K 7/1489 | 361/679.33 |
| 8,605,440 B2* | 12/2013 | Gong | H05K 7/1409 | 361/726 |
| 9,706,675 B2* | 7/2017 | Hartman | H05K 7/1402 | |
| 9,727,099 B1* | 8/2017 | Hastings | G06F 1/187 | |
| 9,766,667 B1* | 9/2017 | Singer | H05K 7/1409 | |
| 10,701,464 B2* | 6/2020 | Wilcox | H05K 7/1401 | |
| 2003/0171016 A1* | 9/2003 | Bright | H05K 9/0015 | 439/160 |
| 2004/0264146 A1* | 12/2004 | Kerrigan | H05K 7/1487 | 361/726 |
| 2005/0141827 A1* | 6/2005 | Yamada | G02B 6/4261 | 385/92 |
| 2011/0141685 A1* | 6/2011 | Hung | G06F 1/1632 | 361/679.43 |
| 2012/0275120 A1* | 11/2012 | Nguyen | G02B 6/4284 | 361/747 |
| 2014/0198434 A1* | 7/2014 | Ho | G06F 1/187 | 361/679.01 |
| 2017/0045922 A1 | 2/2017 | Heyd et al. | | |
| 2017/0060176 A1 | 3/2017 | Lien et al. | | |
| 2017/0118851 A1 | 4/2017 | Lin et al. | | |
| 2018/0160563 A1 | 6/2018 | Hung et al. | | |
| 2019/0018207 A1 | 1/2019 | Koutrokois | | |
| 2019/0137716 A1 | 5/2019 | Solheid et al. | | |
| 2020/0396858 A1* | 12/2020 | Wu | H05K 7/1489 | |

\* cited by examiner

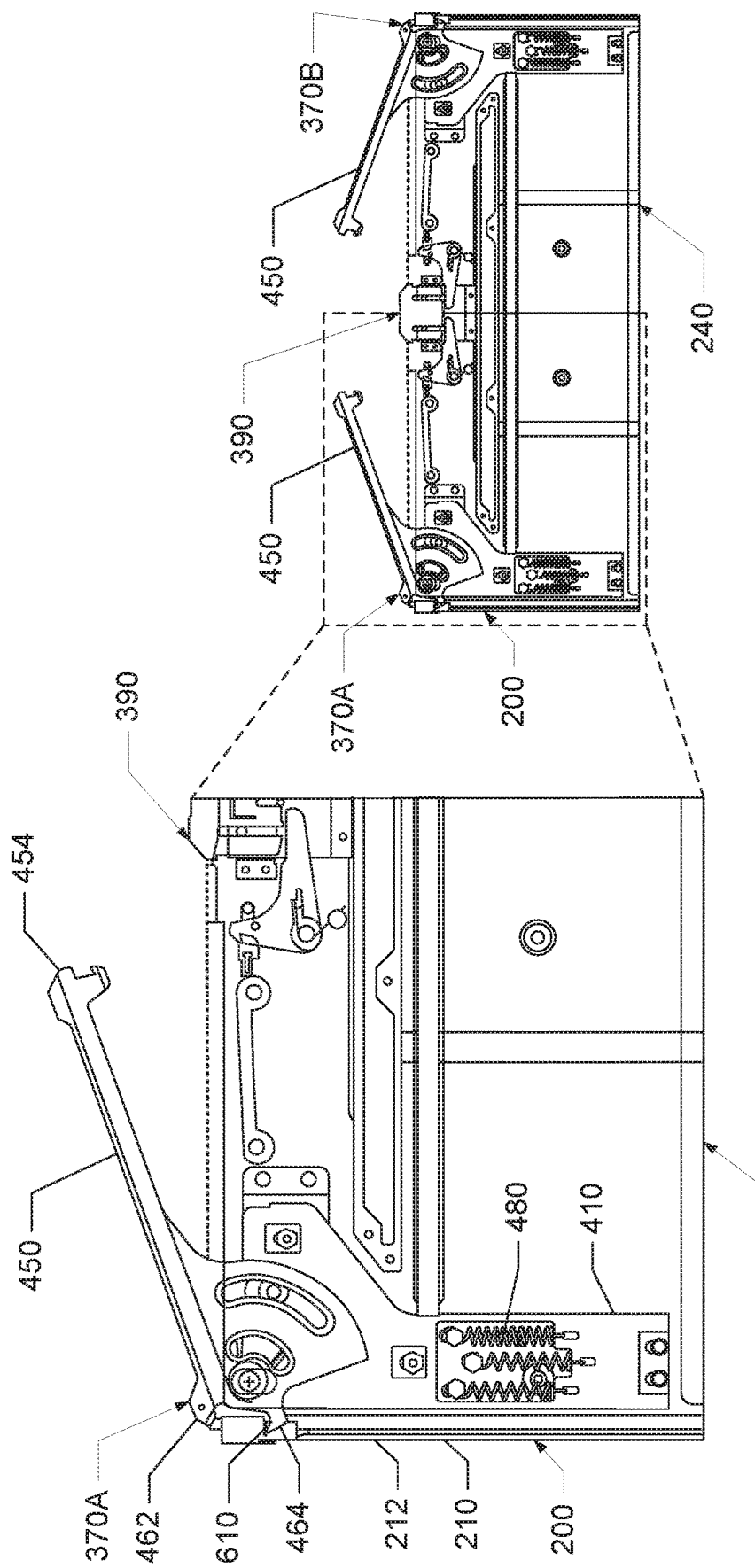

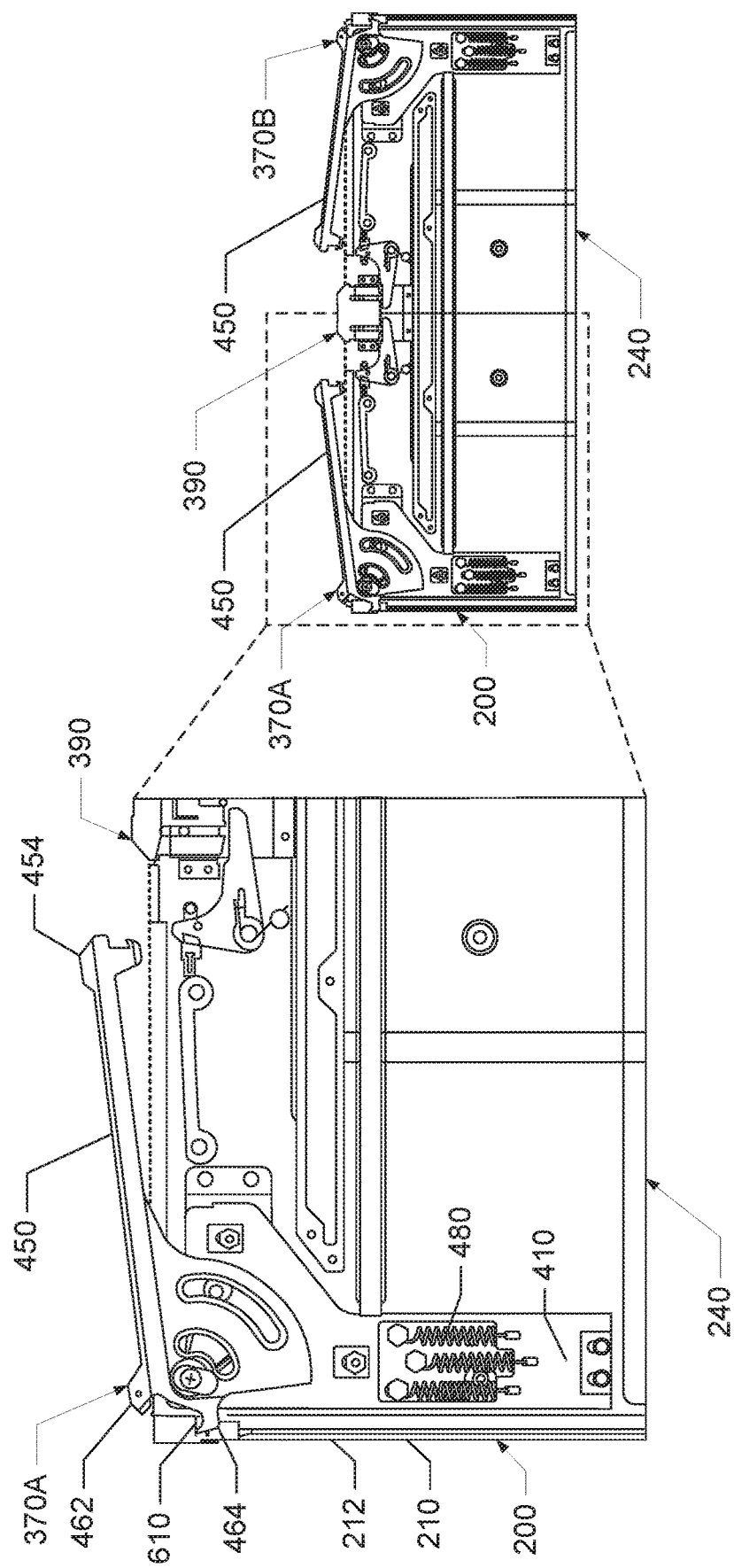

ELECTRONIC MODULE CARRIER FOR AN INFORMATION HANDLING SYSTEM

BACKGROUND

1. Technical Field

The present disclosure generally relates to information handling systems and in particular to an electronic module carrier for an information handling system.

2. Description of the Related Art

As the value and use of information continue to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Some information handling systems are housed within a chassis that can be installed in a rack. A rack is a framed structure that is often capable of providing shared power, cooling, networking, and/or management infrastructure to one or more information handling system components. Examples of information handling system components that can be housed within a chassis include, but are not limited to, computing nodes, server blades, input/output (IO) modules, storage devices, and network cards. The information handlings system components can include connectors that are subject to vibration and motion during use of the information handling system. Unfortunately, the vibrations can cause the connectors to move and possibly become disconnected.

BRIEF SUMMARY

Disclosed are an information handling system (IHS), an electronic module (EM) carrier, and a method of manufacturing an EM carrier.

According to one embodiment, an IHS includes a sliding bracket coupled to an EM carrier and a handle coupled to the sliding bracket. The handle and sliding bracket are configured to engage with a stationary chassis to hold the EM carrier at a first position in a bay of the stationary chassis when the handle is open. The sliding bracket is further configured to translate the EM carrier toward a second position in the stationary chassis when the handle is moved from an open position towards a closed position. In the second position, an EM carrier connector of the EM carrier is engaged with a sled connector of a sled, and, in the first position, the EM carrier connector is disengaged from the sled connector.

According to a next embodiment, an EM carrier includes a sliding bracket coupled to the EM carrier and a handle coupled to the sliding bracket. The handle and sliding bracket are configured to engage with a stationary chassis to hold the EM carrier at a first position in a bay of the stationary chassis when the handle is open. The sliding bracket is further configured to translate the EM carrier to a second position in the stationary chassis when the handle is moved from an open position towards a closed position. In the second position, an EM carrier connector of the EM carrier is engaged with a sled connector of a sled, and, in the first position, the EM carrier connector is disengaged from the sled connector.

According to another embodiment, a method of manufacturing an EM carrier includes providing a sliding bracket, a cover, a base, a handle having a first end and a second end with an attached cam, and a plurality of springs. The second end of the handle is attached to the sliding bracket. The handle is configured to rotate relative to the sliding bracket. The sliding bracket is coupled to the cover via a plurality of guide fasteners such that that the sliding bracket can move about the guide fasteners along an axis parallel to the cover. The first ends of the plurality of springs are attached to the sliding bracket and the second ends of the plurality of springs are attached to the cover. The cover is mounted to the base.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which:

FIG. 6A presents an enlarged top view of a left portion of an EM carrier in a stationary chassis, illustrating details of the cam mechanism in an open position, according to one or more embodiments;

FIG. 6B presents a top view of an EM carrier in a stationary chassis, illustrating details of the cam mechanism in an open position, according to one or more embodiments;

FIG. 7A presents an enlarged top view of a left portion of an EM carrier in a stationary chassis, illustrating details of the cam mechanism translating the EM carrier into the stationary chassis, according to one or more embodiments;

FIG. 7B presents a top view of an EM carrier in a stationary chassis, illustrating details of the cam mechanism translating the EM carrier into the stationary chassis, according to one or more embodiments;

DETAILED DESCRIPTION

Figure 1:
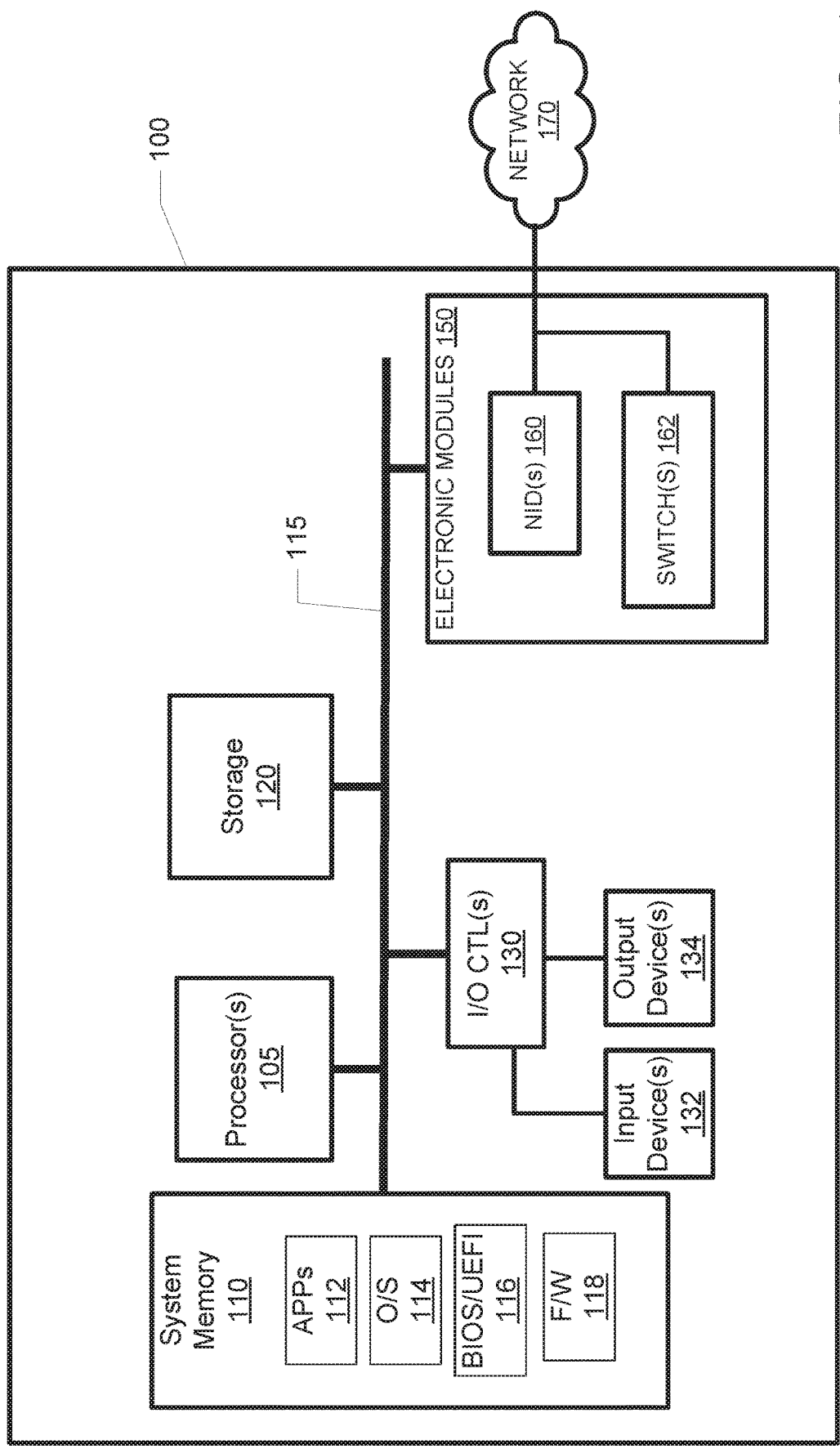
FIG. 1 illustrates an example information handling system within which various aspects of the disclosure can be implemented, according to one or more embodiments.

The illustrative embodiments provide an information handling system (IHS), an electronics module (EM) carrier, and a method of manufacturing the EM carrier. The EM carrier includes a sliding bracket coupled to the EM carrier and a handle coupled to the sliding bracket, the sliding bracket is configured to engage with a stationary chassis to hold the EM carrier in the stationary chassis at a first position when the handle is open. The EM carrier is positioned or located in a first position in a bay of the stationary chassis. The sliding bracket is further configured to translate the EM carrier to a second position in the stationary chassis when the handle is moved from an open position towards a closed position. In the second position, an EM carrier connector of the EM carrier is engaged with a sled connector of a sled and, in the first position, the EM carrier connector is disengaged from the sled connector.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized, and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

FIG. 1 illustrates a block diagram representation of an example information handling system (IHS) 100, within which one or more of the described features of the various embodiments of the disclosure can be implemented. For purposes of this disclosure, an information handling system, such as IHS 100, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring specifically to FIG. 1, example IHS 100 includes one or more processor(s) 105 coupled to system memory 110 via system interconnect 115. System interconnect 115 can be interchangeably referred to as a system bus, in one or more embodiments. Also coupled to system interconnect 115 is storage 120 within which can be stored one or more software and/or firmware modules and/or data (not specifically shown). In one embodiment, storage 120 can include one or more hard drives or solid-state drives that are mounted within a system enclosure as will be described below. The one or more software and/or firmware modules within storage 120 can be loaded into system memory 110 during operation of IHS 100. As shown, system memory 110 can include therein a plurality of software and/or firmware modules including application(s) 112, operating system (O/S) 114, basic input/output system (BIOS) 116 and firmware (F/W) 118.

In one or more embodiments, BIOS 116 comprises additional functionality associated with unified extensible firmware interface (UEFI) and the combined modules/functionality can be more completely referred to as BIOS/UEFI in these embodiments. The various software and/or firmware modules have varying functionality when their corresponding program code is executed by processor(s) 105 or other processing devices within IHS 100.

IHS 100 further includes one or more input/output (I/O) controllers 130 which support connection by, and processing of signals from, one or more connected input device(s) 132, such as a keyboard, mouse, touch screen, or microphone. I/O controllers 130 also support connection to and forwarding of output signals to one or more connected output devices 134, such as a monitor or display device or audio speaker(s) or light emitting diodes (LEDs).

IHS 100 further comprises one or more electronic modules (EM) 150 that are communicatively coupled to system interconnect 115. EM 150 can include a variety of devices, such as network interface device (NID) 160 and switch(es) 162. NID 160 enables IHS 100 to communicate and/or interface with other devices, services, and components that are located external to IHS 100. These devices, services, and components can interface with IHS 100 via an external network, such as example network 170, using one or more communication protocols.

Switch(es) 162 are computer networking devices that connect devices on a computer network by using packet switching to receive, process, and forward data to the destination device. A switch is a multiport network bridge that uses hardware addresses to process and forward data at the data link layer (layer 2) or the network layer (layer 3).

Network 170 can be a local area network, wide area network, personal area network, and the like, and the connection to and/or between network 170 and IHS 100 can be wired or wireless or a combination thereof. For purposes of discussion, network 170 is indicated as a single collective component for simplicity. However, it is appreciated that network 170 can comprise one or more direct connections to other devices as well as a more complex set of interconnections as can exist within a wide area network, such as the Internet.

Figure 2A:
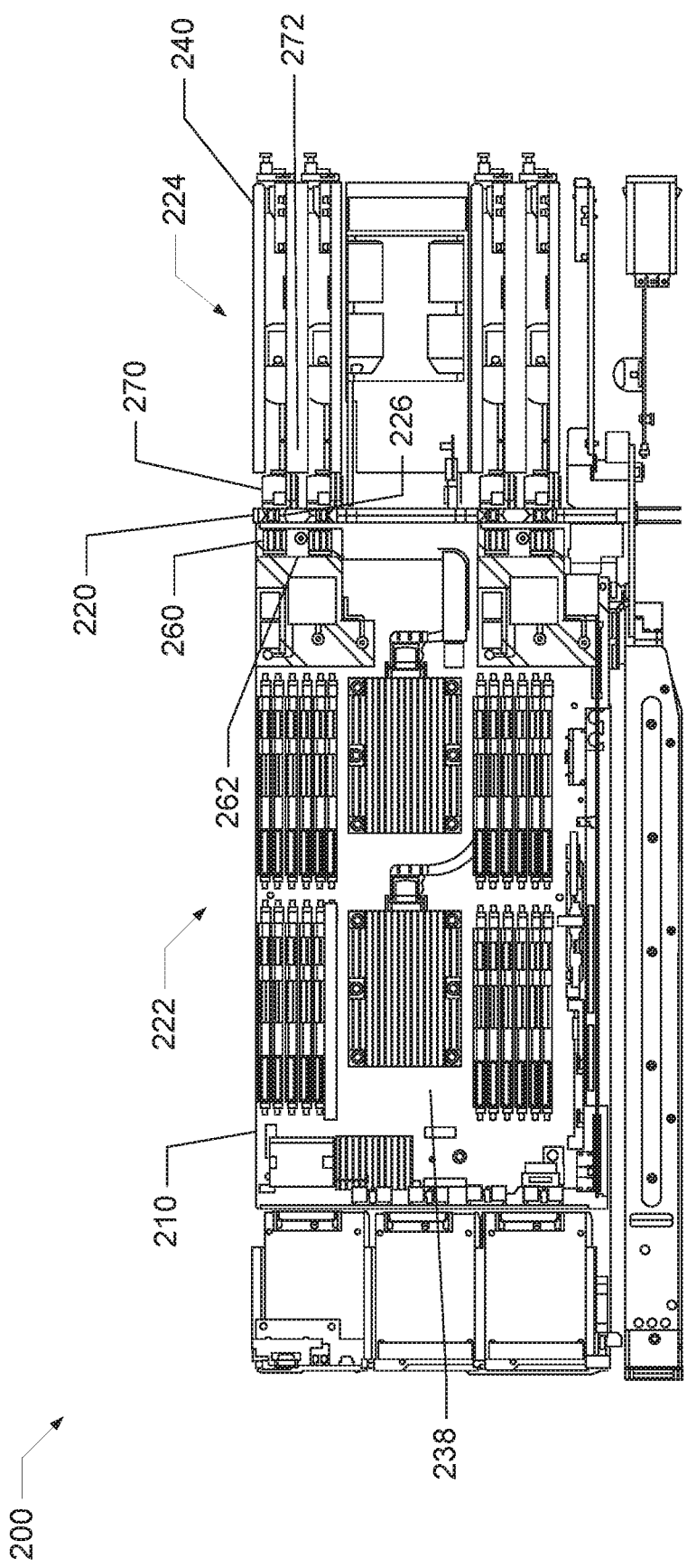
FIG. 2A illustrates a side view of an information handling system chassis with the side panels removed, according to one or more embodiments.
Figure 2B:
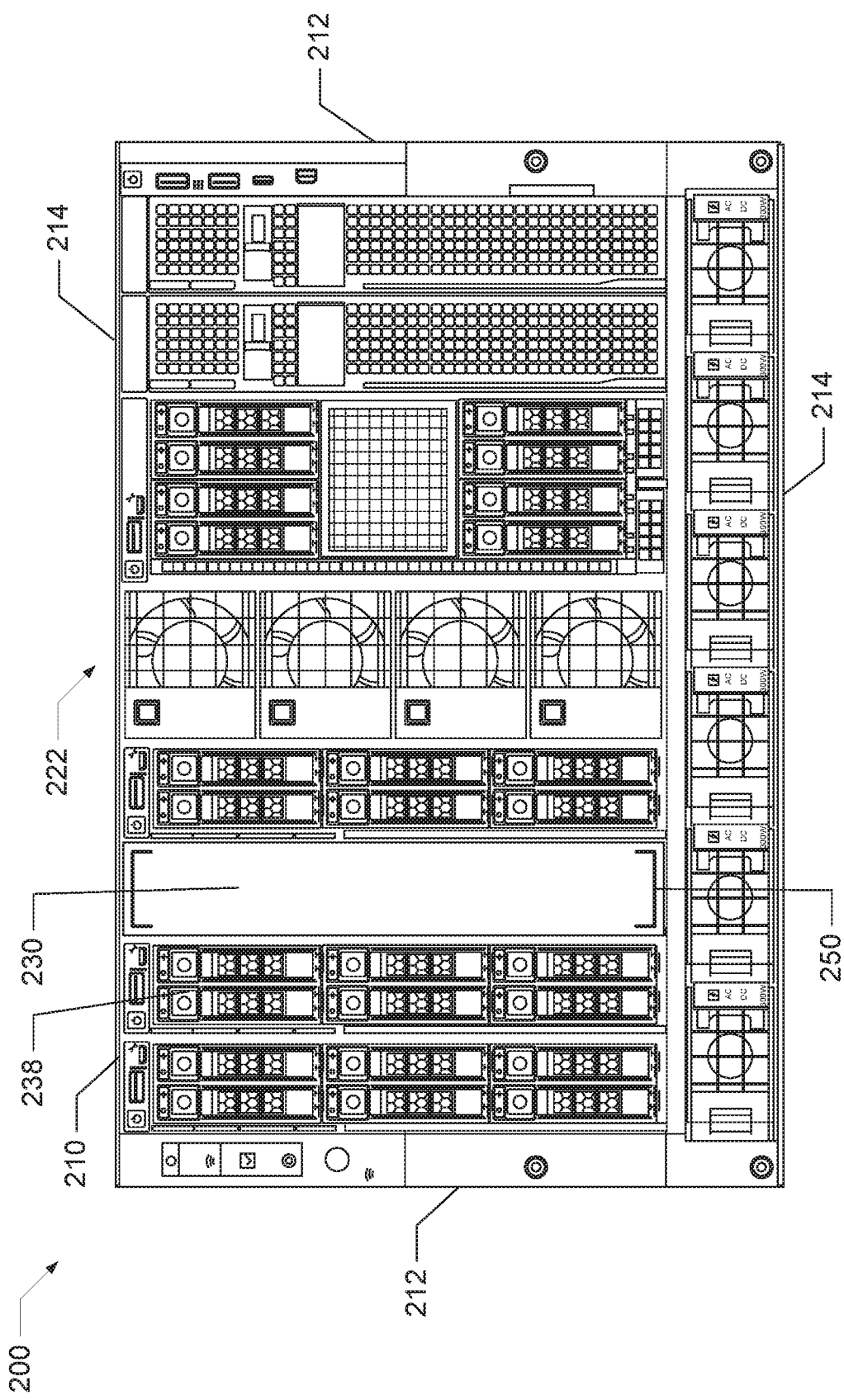
FIG. 2B illustrates a front view of an information handling system chassis, according to one or more embodiments.
Figure 2C:
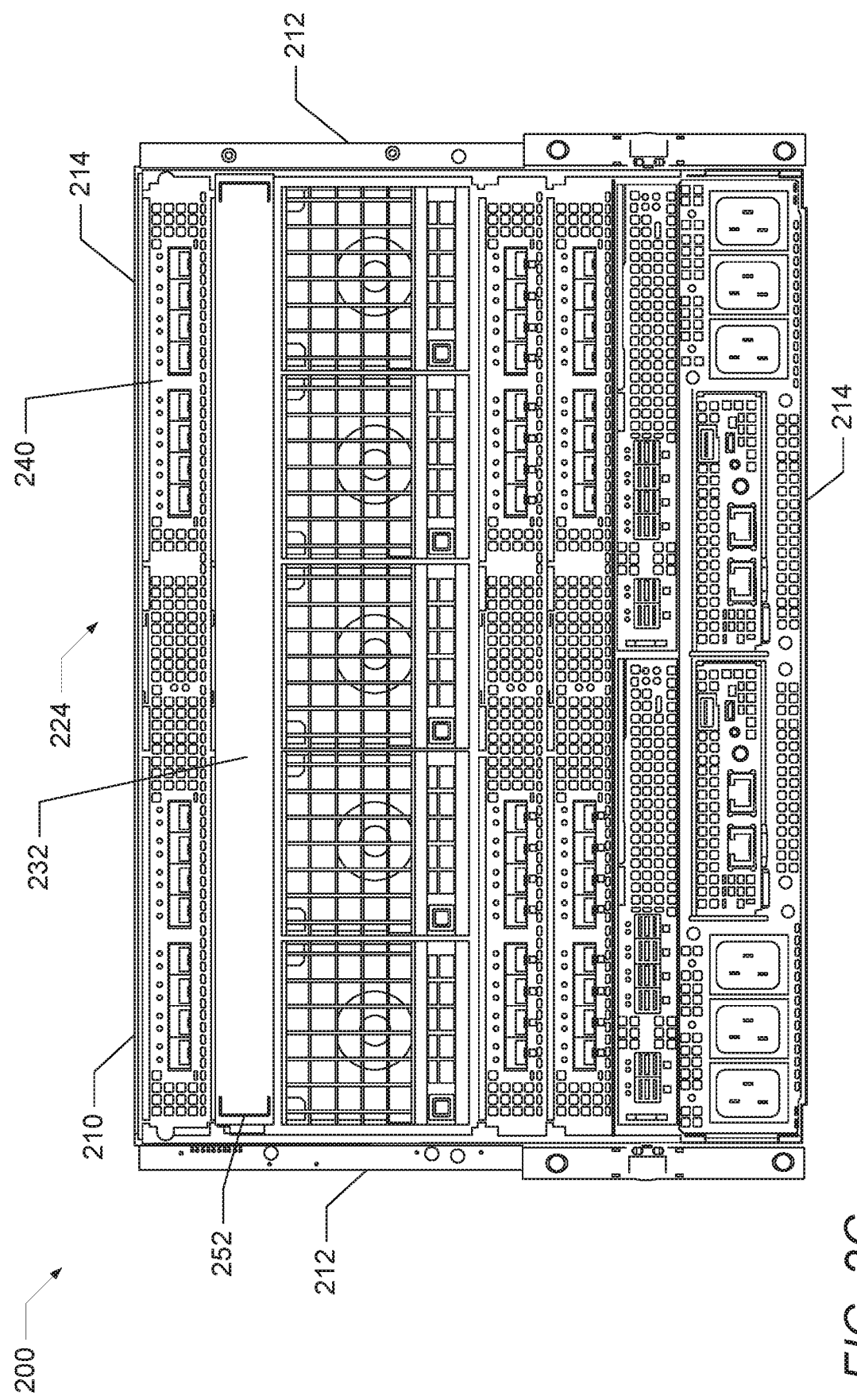
FIG. 2C illustrates a rear view of an information handling system chassis, according to one or more embodiments.

In the discussion of the following figures, the description of each figure can include general reference to the specific components illustrated within the preceding figures. Turning to FIGS. 2A-C, there are illustrated several views of stationary chassis 200. Stationary chassis 200 will be described concurrently with FIGS. 2A-C. Stationary chassis 200 can package and contain the various components of IHS 100. Stationary chassis 200 includes a frame 210 that has a pair of spaced-apart, vertically oriented walls 212 and a pair of spaced-apart, horizontally oriented walls 214. A bulkhead 220 is mounted to and located within frame 210 and extends between horizontally oriented walls 214. Bulkhead 220 divides stationary chassis 200 into a front portion 222 and a rear portion 224. Several openings 226 are defined in bulkhead 220 and extend through bulkhead 220 between front portion 222 and rear portion 224.

Sled bays 230 are defined in the front portion 222 and EM bays 232 are defined in the rear portion 224 of stationary chassis 200. Sled bays 230 are dimensioned to receive a sled 238 and EM bays 232 are dimensioned to receive an EM carrier 240. Sled 238 can contain components of storage 120 of IHS 100 such as hard drives or can contain processor(s) 105 of IHS 100. EM carrier 240 can contain components of EM modules 150 of IHS 100, such as NID(s) 160 and switch(es) 162. Stationary chassis 200 can hold multiple sleds 238 in different sled bays and multiple EM carriers 240 in different EM bays.

A pair of spaced-apart, opposed channels 250 is mounted to frame 210 in front portion 222 and extend into sled bay 230. Sled 238 can slide into and be received by channels 250. Similarly, a pair of spaced-apart opposed channels 252 is mounted to frame 210 in rear portion 224 and extend into EM carrier bay 232. EM carrier 240 can slide into and be received by channels 252.

Sled 238 includes a sled connector 260 that is mounted to a sled printed circuit board (PCB) 262 of sled 238. Components of storage 120 or components of processor(s) 105 can be mounted to sled PCB 262. Sled connector 260 can carry electrical signals from sled 238. EM carrier 240 includes an EM carrier connector 270 that is mounted to a EM PCB 272 of EM carrier 240. Components of EM 150 can be mounted to EM PCB 272. EM carrier connector 270 can carry electrical signals from EM carrier 240 to sled 238. Sled connector 260 partially extends into opening 226 and mates with EM carrier connector 270, which also partially extends into opening 226. When mated together, sled connector 260 and EM carrier connector 270 enable communications between components of sled 238 and EM carrier 240.

Figure 2D:
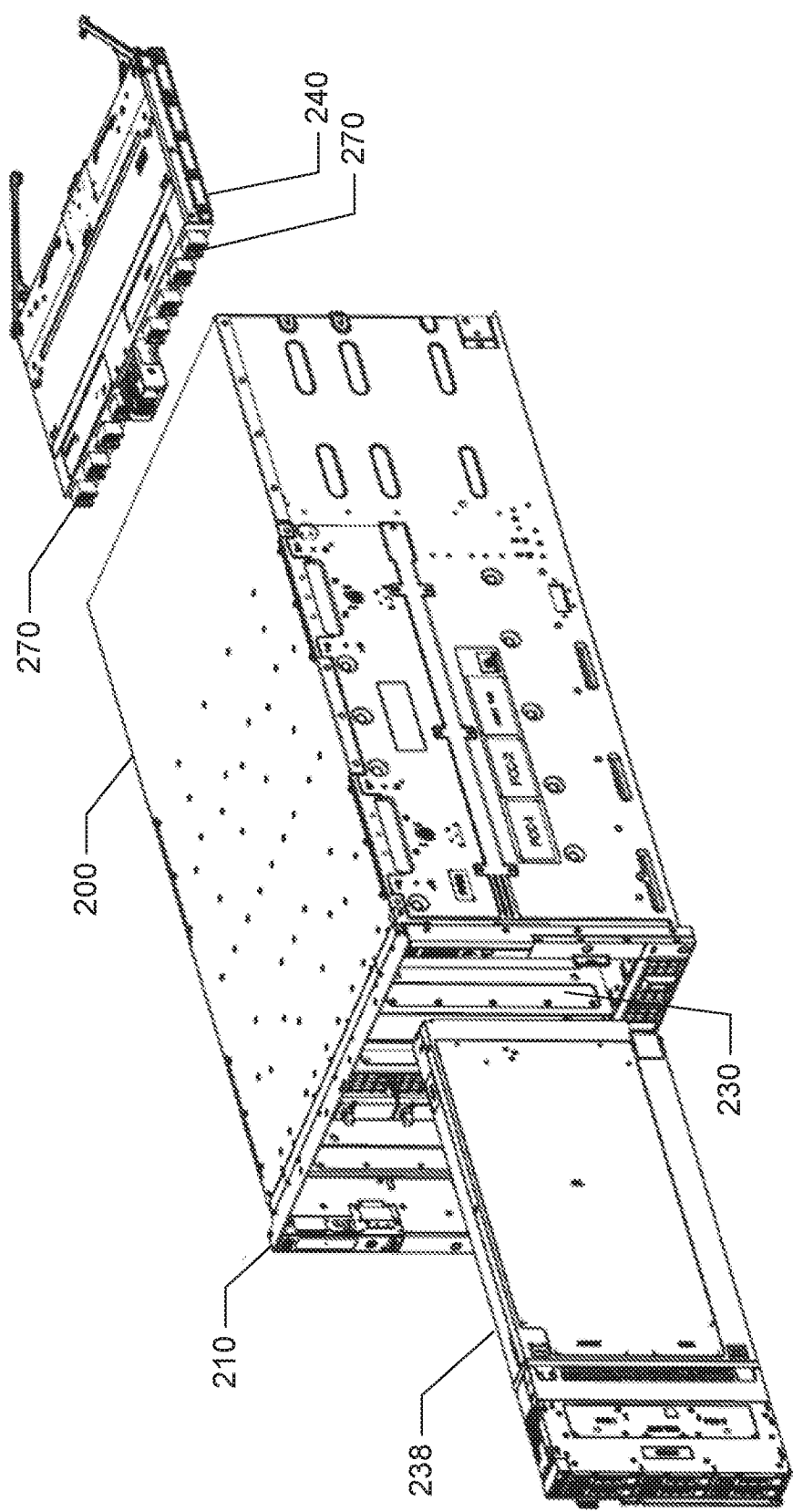
FIG. 2D illustrates a front perspective view of an information handling system chassis, according to one or more embodiments.
Figure 2E:
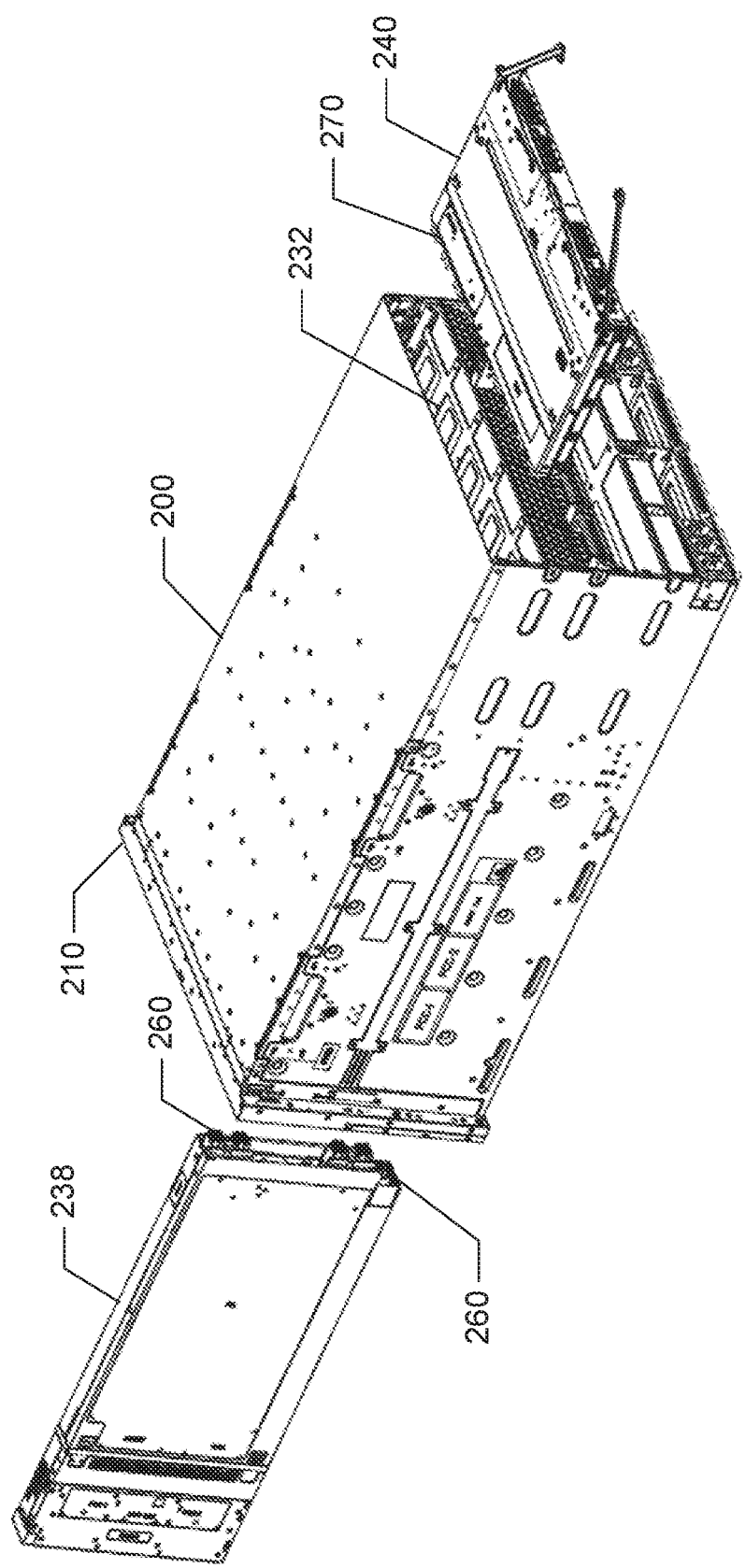
FIG. 2E illustrates a rear perspective view of an information handling system chassis, according to one or more embodiments.

Turning to FIG. 2D, sled 238 is shown in a position where sled 238 can be manually moved by a user into sled bay 230 of stationary chassis 200. Several EM carrier connectors 270 are shown extending away from a rear portion of EM carrier 240. Referring to FIG. 2E, EM carrier 240 is shown in a position where EM carrier 240 can be manually moved by a user into EM bay 232 of stationary chassis 200. Several sled connectors 260 are shown extending away from a rear portion of sled 238.

Figure 2F:
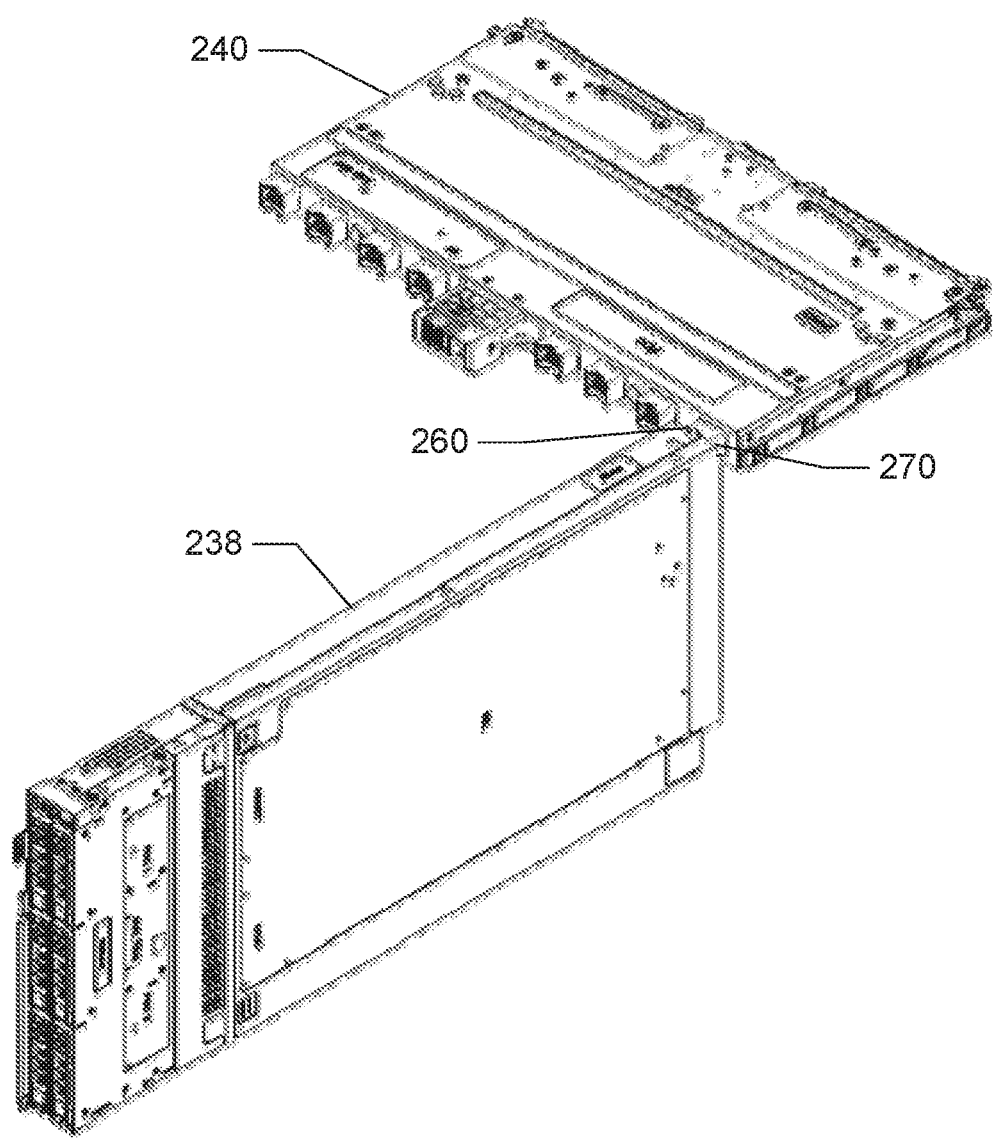
FIG. 2F illustrates a front perspective view of a sled mated to an EM carrier with a stationary chassis removed, according to one or more embodiments.
Figure 2G:
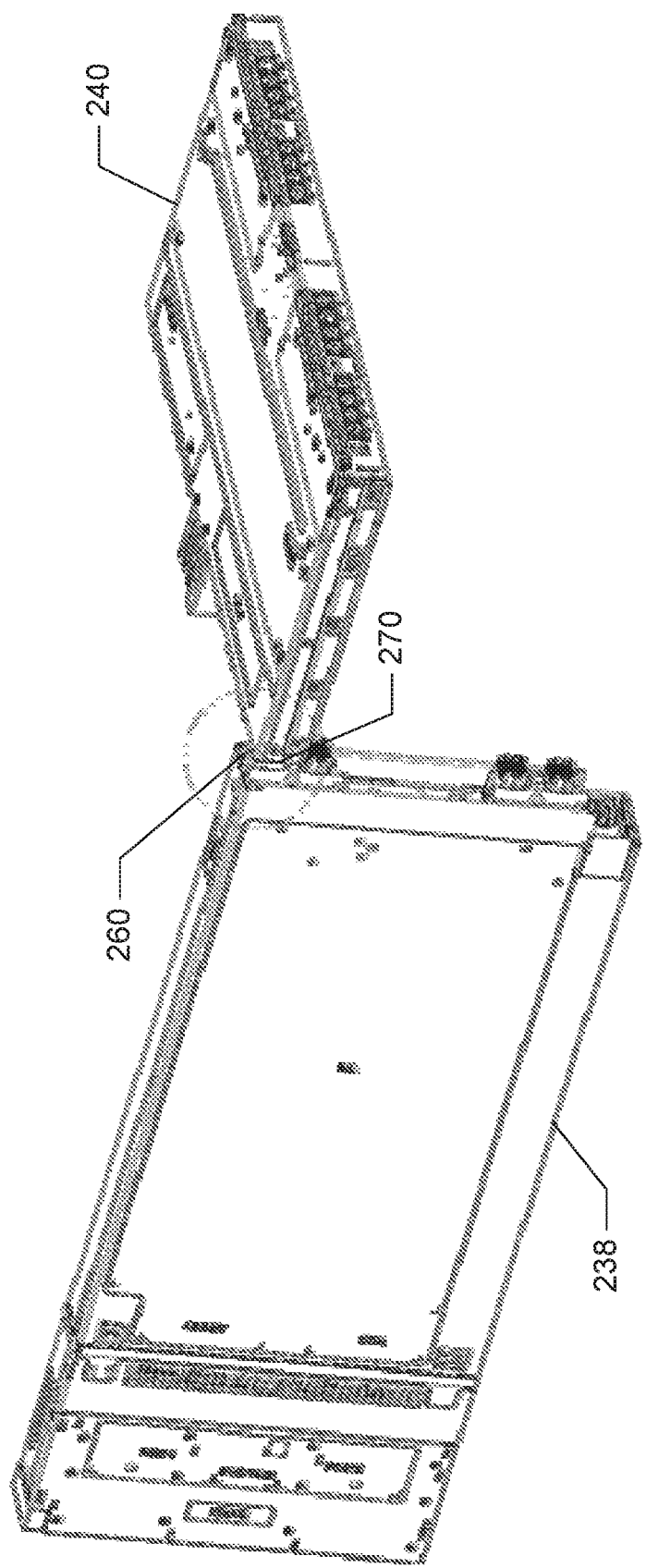
FIG. 2G illustrates a rear perspective view of a sled mated to an EM carrier with a stationary chassis removed, according to one or more embodiments.

FIGS. 2F and 2G illustrate a sled connector 260 mated with an EM carrier connector 270 with the stationary chassis 200 removed. Electrical contacts (not shown) within sled connector 260 mate with electrical contacts (not shown) within EM carrier connector 270. In one embodiment, the electrical contacts of sled connector 260 and EM carrier connector 270 can both be U-shaped blades that are dimensioned to mate with each other when connected. In one aspect, sled 238 can be generally oriented orthogonal to EM carrier 240. Each sled connector 260 would mate with a corresponding EM carrier connector 270 when respective sleds and EM carriers are placed into stationary chassis 200.

Figure 3A:
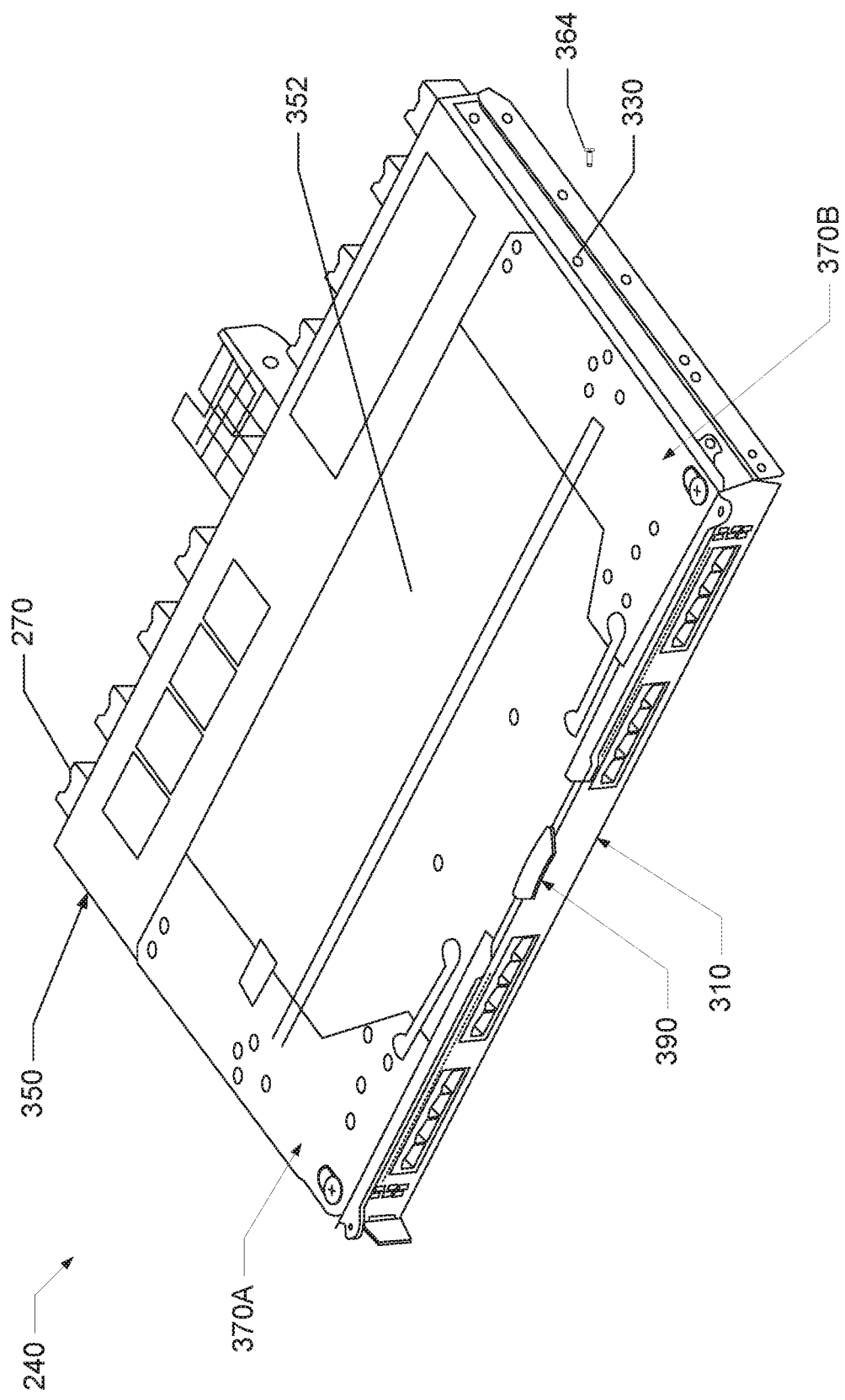
FIG. 3A illustrates a perspective view of the top of an electronic module (EM) carrier, according to one or more embodiments.
Figure 3B:
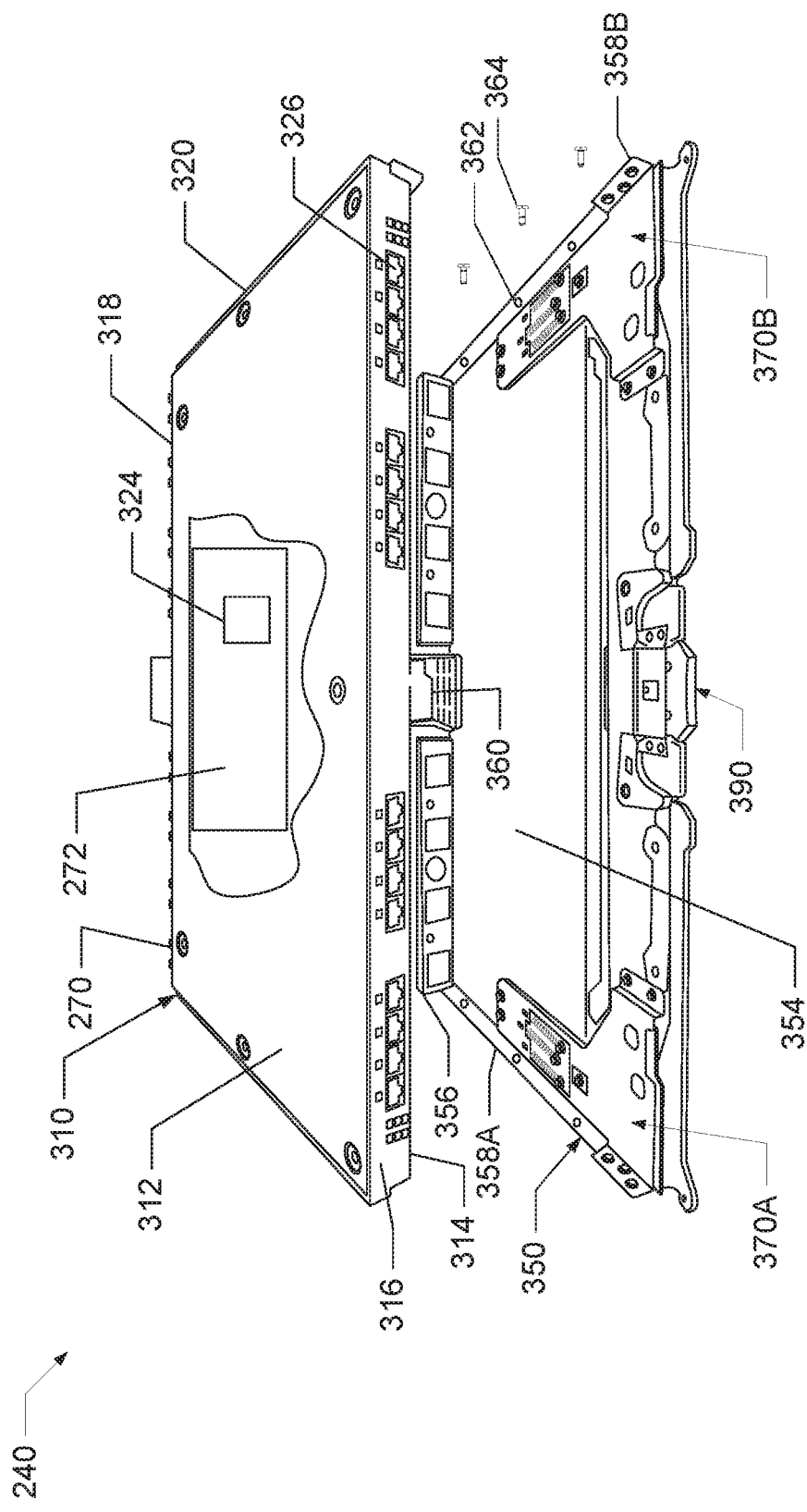
FIG. 3B illustrates a perspective view of the bottom of an EM carrier, according to one or more embodiments.

With reference now to FIGS. 3A and 3B, details of EM carrier 240 are shown. FIG. 3A illustrates a perspective view of the top of EM carrier 240 and FIG. 3B illustrates a perspective view of the bottom of EM carrier 240. EM carrier 240 includes a base 310 and a cover 350. In FIG. 3A, cover 350 is shown mounted to base 310 and in FIG. 3B, cover 350 is shown separate from base 310. Base 310 includes an outer surface 312, an inner surface 314, front 316, back 318, and sides 320. EM connector 270 extends away from back 318. A portion of outer surface 312 is cut away to show the location of EM PCB 272. EM PCB 272 is mounted within base 310 to inner surface 314. EM carrier connector 270 is mounted to EM PCB 272. Electronic components 324 of EM 150 can be mounted to EM PCB 272. Several cable receptacles 326 are mounted to front 316. Cable receptacles 326 can receive various cables such as fiber optic cables or Ethernet cables.

Cover 350 includes an outer surface 352, an inner surface 354, back wall 356 and side walls 358A and 358B. Connector opening 360 is defined in back wall 356. EM carrier connector 270 extends through connector opening 360. Holes 362 are located in side walls 358A and 358B. Fasteners 364 such as screws are mounted to extend through holes 362 and are received by threaded holes 330 in base 310. Fasteners 364 secure or attach cover 350 to base 310.

A pair of cam mechanisms 370A and 370B are mounted to opposite sides of cover 350, juxtaposed to inner surface 354 (FIG. 3B). One cam mechanism 370A is adjacent to one side wall 358A and another cam mechanism 370B is adjacent to the other side wall 358B. Latch 390 is mounted to inner surface 354 between cam mechanisms 370A and 370B. When actuated by a user, cam mechanisms 370A and 370B can move or translate EM carrier 240 into stationary chassis 200 and latch 390 locks EM carrier 240 in stationary chassis 200, as will be described in more detail later.

Figure 4A:
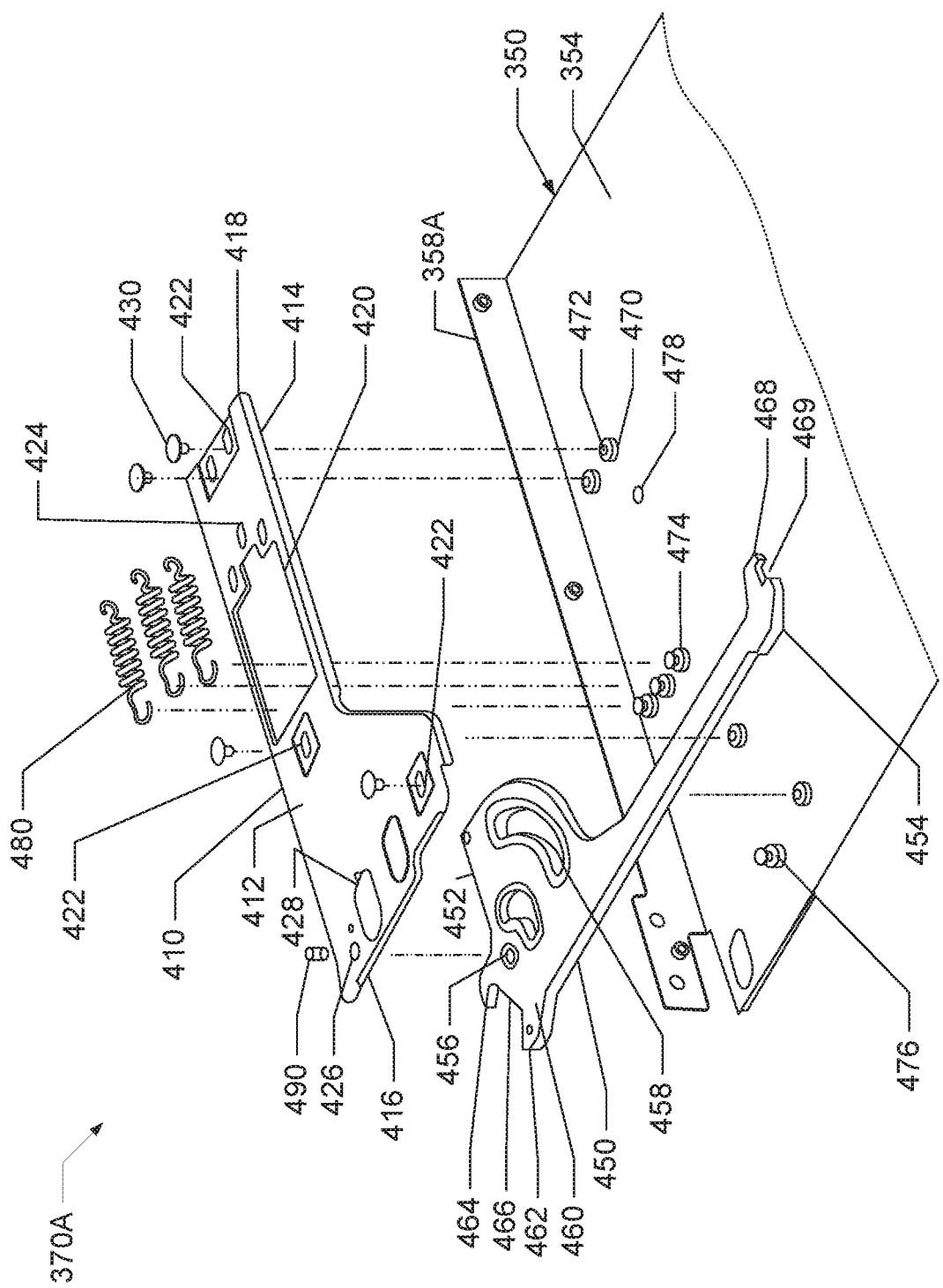
FIG. 4A illustrates an exploded view of a cam mechanism, according to one or more embodiments.

With reference now to FIG. 4A, details of cam mechanism 370A are illustrated. Cam mechanism 370B includes the same components as cam mechanism 370A. Cam mechanism 370A comprises sliding bracket 410, handle 450 and springs 480. Sliding bracket 410 and handle 450 can be formed from suitable materials such as metal. Sliding bracket 410 is generally planar in shape. Sliding bracket 410 includes upper surface 412, bottom surface 414, first end 416 and second end 418. Sliding bracket 410 further includes cutout 420, guide slots 422, spring hook apertures 424, pivot pin hole 426, and openings 428.

Handle 450 includes ends 452 and 454, pivot pin bore 456, and arc shaped openings 458. A cam 460 is defined in end 452. Cam 460 has a pair of spaced-apart outer pawls 462 and inner pawls 464 that extend away from cam 460. Recess 466 is located between pawls 462 and 464. Jaw 468 is located at end 454 and defines cavity 469 between jaw 468. Handle 450 is rotatably coupled to sliding bracket 410 by pivot pin 490. Handle 450 is mounted adjacent to bottom surface 414 of sliding bracket 410. Pivot pin 490 can be press fit into pivot pin hole 426 and pivot pin bore 456. Handle 450 can rotate relative to sliding bracket 410 about pivot pin 490.

Several additional features are shown mounted to inner surface 354 of cover 350. Several bosses 470 are attached to inner surface 354 and extend upwardly away from inner surface 354. Each of the bosses 470 has a threaded hole 472 located therein. Several posts 474 are attached to inner surface 354 and extend upwardly away from inner surface 354. Posts 474 can be screwed into threaded holes (not shown). A guide pin 476 is attached to inner surface 354 and extends upwardly away from inner surface 354. Bosses 470, posts 474, and guide pin 476 can all have threaded ends that are received or screwed into threaded holes 478 in inner surface 354.

Figure 4B:
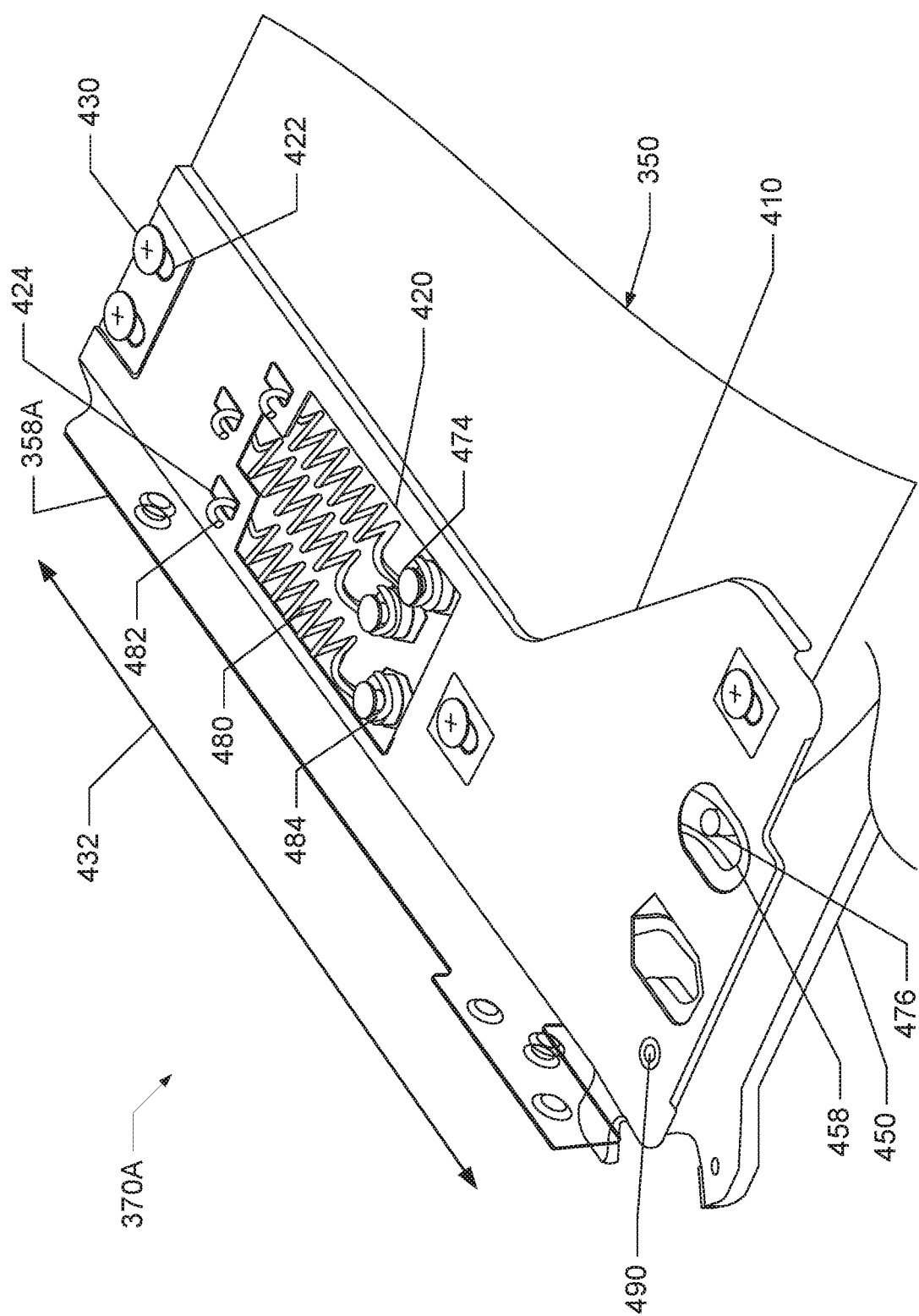
FIG. 4B illustrates a perspective assembled view of a cam mechanism, according to one or more embodiments.

With additional reference to FIG. 4B, sliding bracket 410 is moveably or slidably coupled to cover 350 by guide fasteners 430. In one embodiment, guide fasteners 430 can be threaded screws or bolts. Guide fasteners 430 extend through guide slots 422 and are screwed into or received by threaded holes 472 of bosses 470 (FIG. 4A). Guide slots 422 allow sliding bracket 410 to move parallel or linearly relative to cover 350 along an axis 432. Axis 432 is generally parallel to side walls 358A and 358B. Sliding bracket 410 is limited in movement by guide fasteners 430 contacting the ends of guide slots 422. The bottom surface 414 of sliding bracket 410 is mounted juxtaposed to the inner surface 354 of cover 350. Handle 450 is disposed between the bottom surface 414 of sliding bracket 410 and inner surface 354 of cover 350. Handle 450 can rotate relative to sliding bracket 410 about pivot pin 490.

Springs 480 are mounted in cutout 420. In one embodiment, springs 480 can be coil springs that have hook ends 482 and 484. Hook ends 482 are received in apertures 424, thereby coupling springs 480 to sliding bracket 410. Hook ends 482 are hooked or attached to posts 474, thereby coupling springs 480 to cover 350. Springs 480 act as the linkage between the sliding bracket 410 and cover 350 (of EM carrier 240). Springs 480 are stretched during the installation of EM carrier 240 in stationary chassis 200 (FIG. 2C) as will be described later.

Guide pin 476 extends upwardly away from inner surface 354 and into guide slot 458. As handle 450 is rotated, guide pin 476 tracks or slides within guide slot 458, thereby guiding the movement of handle 450.

Figure 5:
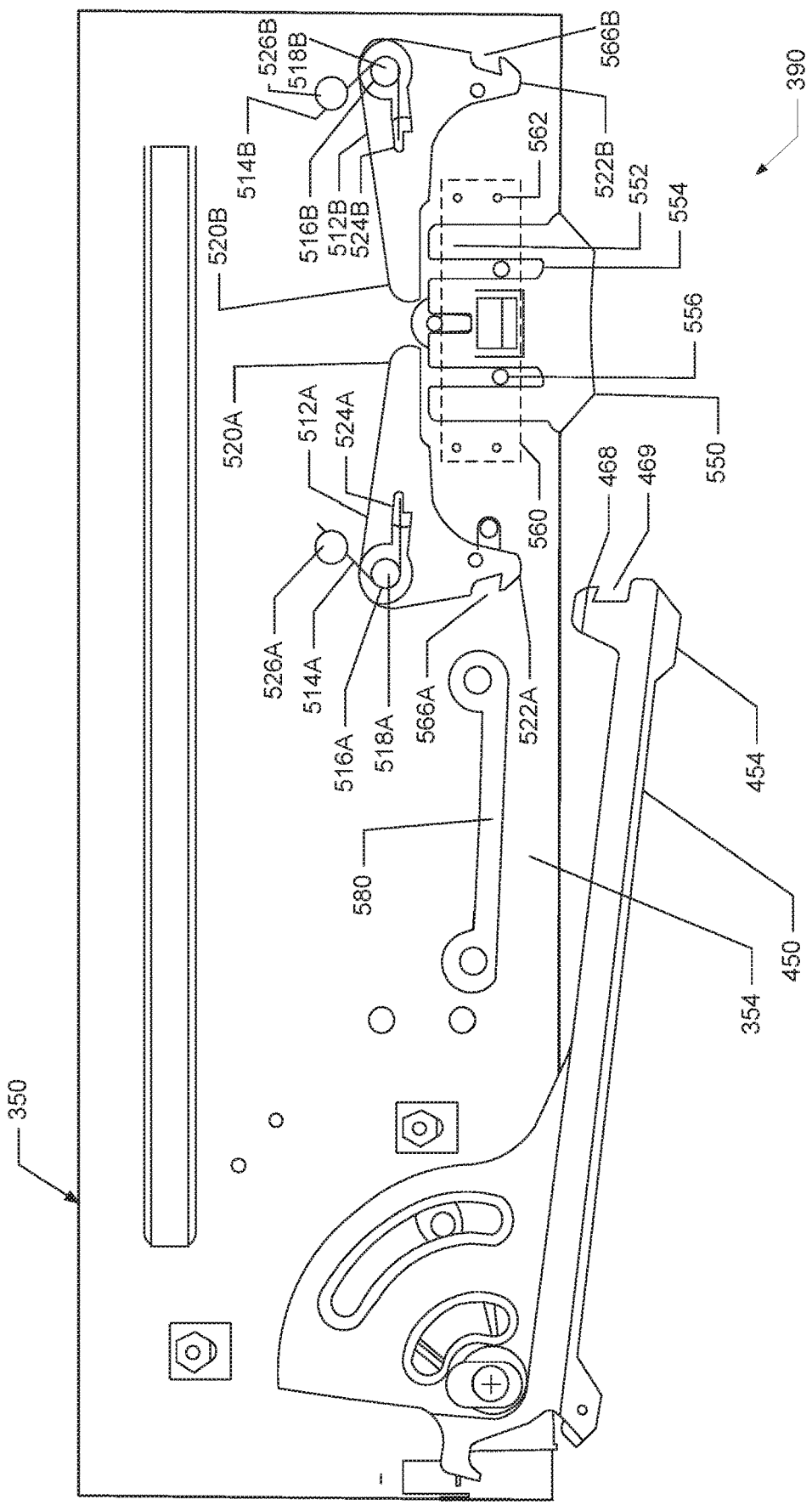
FIG. 5 illustrates a top view of a latch of the EM carrier of FIG. 3B, according to one or more embodiments.

Referring to FIG. 5, there is shown details of latch 390. In FIG. 5, only the left side handle 450 is shown. Latch 390 operates with both the right side handle 450 and the left side handle 450. Latch 390 will be described with reference to the operation with the right side handle 450. Latch 390 operates in the same manner with the right side handle. Latch 390 includes a pair of rocker arms 512A and 512B, springs 514A and 514B and button 550. Each rocker arm has respective bores 516A and 516B. Posts 518A and 518B are mounted to inner surface 354 and extend upwardly into respective bores 516A and 516B. Rocker arm 512A can pivot or rotate about post 518A and rocker arm 512B can pivot or rotate about post 518B.

Rocker arm 512A has a leg 520A and an arm 522A. Rocker arm 512B has a leg 520B and an arm 522B. Groove 524A is located in the upper surface of rocker arm 512A adjacent to bore 516A. Groove 524B is located in the upper surface of rocker arm 512B adjacent to bore 516B. Columns 526A and 526B are mounted to inner surface 354 and extend upwardly. Spring 514A wraps around post 518A and has one end retained in groove 524A and the other end retained by column 526A. Similarly, spring 514B wraps around post 518B and has one end retained in groove 524B and the other end retained by column 526B. Spring 514A urges or biases rocker arm 512A to rotate in a clockwise direction about post 518A. Spring 514B urges or biases rocker arm 512B to rotate in a counter-clockwise direction about post 518B.

Button 550 includes three fingers 552 that extend away from one end of button 550. Slots 554 are defined between fingers 552. Pins 556 are mounted to inner surface 354 and extend upwardly into respective slots 554. A plate 560 (shown in dashed lines) is mounted over button 550 and retains button 550 to cover 350. Plate 560 is attached to inner surface 354 by fasteners 562 such as rivets. Button 550 can slide along pins 556 towards and away from rocker arms 512A and 512B. Notch 566A is defined in arm 522A and notch 566B is defined in arm 522B. End 454 of handle 450 has a jaw 468 that defines cavity 469.

A shoulder 580 extends upwardly from inner surface 354. Shoulder 580 limits the inward movement of handle 450 when the handle is closed. Handle 450 can abut shoulder 580, limiting inward movement of handle 450.

FIGS. 6A and 6B illustrate a sequence of steps of inserting and securing EM carrier 240 into stationary chassis 200. With reference to FIGS. 6A and 6B, EM carrier 240 can be inserted into bay 232 (FIG. 2C) of stationary chassis 200 by a user initially guiding EM carrier 240 into channels 252 (FIG. 2C). EM carrier 240 can slide along channels 252 into bay 232. When EM carrier 240 is being inserted, handles 450 of cam mechanisms 370A, 370B are in an open position. As handles 450 are rotated, ends 454 move toward latch 390. As handles 450 are further moved or rotated, each of the inner pawls 464 of cams 460 contacts or engages lips 610 on respective sides of frame 210. Cam mechanisms 370A, 370B (i.e., sliding brackets 410 and handles 450) engage with stationary chassis 200 to hold EM carrier 240 in the stationary chassis 200 at a first position when the handle 450 is open. In the open position handle 450 can be 30 to 90 degrees from vertical.

FIG. 7A illustrates an enlarged top view of a left portion of EM carrier 240 in stationary chassis 200, illustrating details of the cam mechanism 370A translating the EM carrier into the stationary chassis. FIG. 7B illustrates a top view of EM carrier 240 in stationary chassis 200, illustrating details of the cam mechanisms translating the EM carrier into the stationary chassis Turning to FIGS. 7A and 7B, as handles 450 are further moved toward latch 390, inner pawls 464 of handles 450 press on lips 610 forcing sliding brackets 410 to translate towards bulkhead 220 (FIG. 2A) and to stretch (or tension) springs 480. Handle 450 is coupled to sliding bracket 410 via pivot pin 490, rotary motion of handle 450 is transferred by cam 460 into linear motion of sliding bracket 410 along guide slots 422. At the same time EM connector 270 (FIG. 2A) starts to engage or connect with sled connector 260 (FIG. 2A). The user exerts force on handles 450 to stretch springs 480 and overcome the connector mating force of EM connector 270 to sled connector 260. The movement of handles 450 causes EM connector 270 to mate with sled connector 260.

Sliding brackets 410 receive the pushing forces from handles 450 and travel inward toward bulkhead 220. Sliding brackets 410 are moveable or slideable relative to cover 350. Guide slots 422 (FIG. 4A) allow sliding bracket 410 to move about guide fasteners 430 (FIG. 4A) that are coupled to cover 350 (FIG. 4A). As EM carrier 240 further moves toward bulkhead 220, eventually inward movement of EM carrier 240 stops when EM carrier contacts bulkhead 220.

When EM carrier 240 contacts bulkhead 220, the EM connector 270 is fully engaged or connected with sled connector 260. Cam mechanisms 370A and 370B translate the EM carrier 240 in the stationary chassis 200 to a second position where the handle is closed.

Figures 8A, 8B:
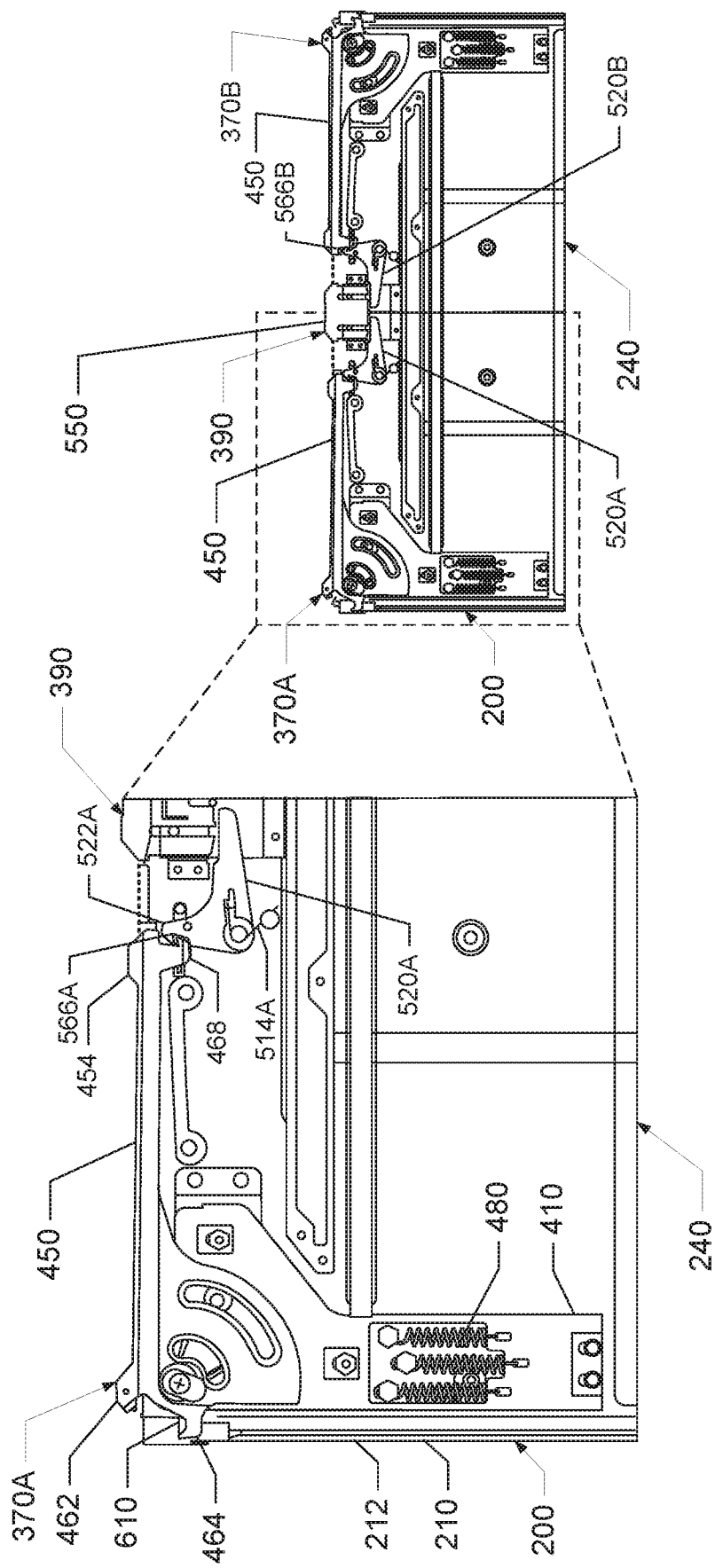
FIG. 8A presents an enlarged top view of a left portion of an EM carrier in a stationary chassis, illustrating details of the cam mechanism in a closed position, according to one or more embodiments.
FIG. 8B presents a top view of an EM carrier in a stationary chassis, illustrating details of the cam mechanism in a closed position, according to one or more embodiments.

FIG. 8A illustrates an enlarged top view of a left portion of EM carrier 240 in stationary chassis 200, illustrating details of the cam mechanism 370A in a closed position. FIG. 8B illustrates a top view of EM carrier 240 in stationary chassis 200, illustrating details of the cam mechanisms in a closed position.

Referring to FIGS. 8A and 8B, as handles 450 are further moved to a closed position by a user, springs 480 will be further stretched or tensioned. Concurrently, jaw 468 will contact end 522A of rocker arm 520A and slide along causing the rocker arm to slightly rotate clockwise allowing jaw 468 to slip into notch 566A. Spring 514A then biases rocker arm 520A to slightly rotate counterclockwise forcing notch 566A over jaw 468 and keeping or locking jaw 468 in notch 566A. Handles 450 are now locked by latch 390. Handles 450 are now in a closed and locked position.

In the closed position of FIGS. 8A and 8B, springs 480 are delivering an inward-pulling force to EM carrier 240 urging or biasing EM carrier 240 further into stationary chassis 200. EM carrier 240 receives an inward pulling force from the contraction of springs 480. This constant pulling force ensures full engagement of EM connector 270 (FIG. 2A) with sled connector 260 (FIG. 2A) when EM carrier 240 (FIG. 2A) and sled 238 (FIG. 2A) are installed in stationary chassis 200. Biasing the EM carrier connector 270 to engage the sled connector 260, via contraction force of springs 480, prevents disengagement of the EM carrier connector 270 from the sled connector 260 during motion or vibration. IHS 100 can experience motion or vibration during operation. The motion or vibration can be between sled 238 and EM carrier 240 or between sled 238 and/or EM carrier 240 and stationary chassis 200. The contraction force of springs 480 enables a lower handle force to engage the EM carrier connector with the sled connector.

EM carrier 240 can be removed from stationary chassis 200 by the manual depression of button 550 and then reversing the steps of FIGS. 6A-8B. When button 550 is depressed, fingers 552A contact legs 520A, 520B causing rockers arms 520A and 520B to rotate, releasing jaws 468 from notches 566A and 566B and unlocking handles 450. Handles 450 can now be manually moved to the open position to remove EM carrier 240 from stationary chassis 200.

The use of spring-loaded cam mechanisms 370A, 370B enables spring contraction to deliver an inward force to pull the EM carrier 240 into the stationary chassis 200 and mate with sled 210. The cam mechanism 370A, 370B each include a sliding bracket 410 that can move relative to the EM carrier, a handle 450 attached to the sliding bracket 410, and springs 480 that link the sliding bracket 410 to cover 350. The use of sliding brackets 410 and springs 480 can generate a higher insertion force to EM carrier 240 provided evenly on each side of EM carrier 240. In one embodiment, sliding brackets 410 and springs 480 can generate a force of approximately 90 to 120 pound-feet that is exerted between EM carrier 240 and stationary chassis 200. The use of spring-loaded cam mechanism 370A, 370B enables EM carrier 240 to travel a larger distance to overcome any deviation in dimensional tolerances.

The use of EM carrier 240 and spring-loaded sliding bracket 410 enables EM carrier 240 to move inside stationary chassis 200 to accommodate the overall tolerance of the stationary chassis. The use of EM carrier 240 and spring-loaded sliding bracket 410 provides the wiping length requirement of the EM carrier connector 270 and sled connector 260.

The use of EM carrier 240 and spring-loaded sliding bracket 410 further enables full connector engagement and accommodates any connector over-mating. The use of spring-loaded cam mechanisms 370A, 370B on both sides of EM carrier 240 provides a dynamic urging or biasing force to secure and sustain the connection between the EM carrier 240 and sled 210. The use of spring-loaded sliding bracket 410 also provides a higher flexibility to adjust the force and the balance of compliance force acting on EM carrier 240 within stationary chassis 200.

Additionally, the use of handle 450 coupled to spring-loaded sliding bracket 410 enables the cam point to be dynamic. Cam mechanisms 370A, 370B can shift to accommodate the overall tolerance of stationary chassis 200. The force from the actuation of cam mechanisms 370A, 370B pushes EM carrier 240 inward until EM carrier 240 fully mates with sled 210, ensuring a valid and reliable connection with sled 210. As the handle 450 continues to rotate inward, the guided movement of EM carrier 240 in stationary chassis 200 accommodates connector over mating and prevents connector damage.

Springs 480 act as the linkage between the sliding bracket 410 and cover 350 (EM carrier 240). Springs 480 are stretched during the installation of EM carrier 240 in stationary chassis 200. The use of a pair of spring-loaded cam mechanisms 370A, 370B with springs 480 on each side of EM carrier 240 generates a continuous force to secure EM connector 270 and sled connector 260. Springs 480 extend when EM carrier 240 travels inward into stationary chassis 200. The contraction of springs 480 generates a compliance force that secures an electrical connection between EM connector 270 and sled connector 260 and withstands operating shock and vibration. IHS 100 can experience motion or vibration during operation. The motion or vibration can be between sled 238 and EM carrier 240 or between sled 238 and/or EM carrier 240 and stationary chassis 200.

Figure 9:
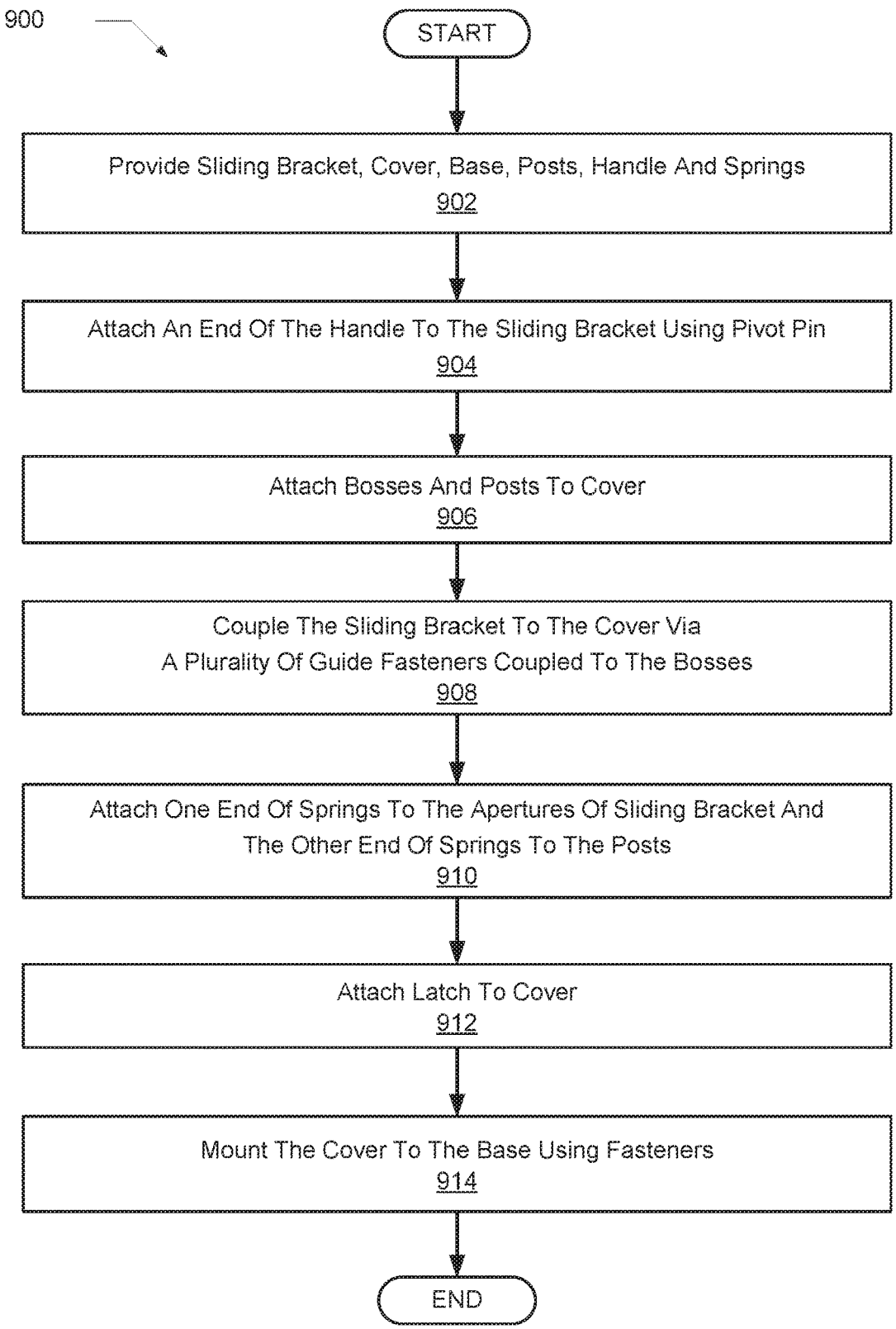
FIG. 9 is a flow chart illustrating an example method of manufacturing the EM carrier, according to one or more embodiments.

FIG. 9 illustrates a flowchart of an exemplary method 900 for manufacturing EM carrier 240 of the preceding figures. The description of the method is provided with general reference to the specific components illustrated within the preceding FIGS. 1-8B. In one embodiment, method 900 can be implemented using automated assembly equipment or machines that are at least partially controlled by a controller or IHS. With specific reference to FIG. 9, method 900 begins at the start block and proceeds to block 902 where sliding bracket 410, cover 310, base 252, posts 474, handle 450 and springs 480 are provided.

Handle 450 is attached to the sliding bracket 410 using pivot pin 490 (block 904). Pivot pin 490 can be press fit into pivot pin hole 426 and pivot pin bore 456. Bosses 470 and posts 474 are attached to inner surface 354 of cover 350 by screwing threaded ends of the bosses and posts into threaded holes 478 (block 906). The sliding bracket 410 is coupled for movement to the cover 350 via a plurality of guide fasteners 430 that are coupled to the bosses 470 (block 908). Threaded ends of the guide fasteners 430 are screwed into threaded holes 472 of bosses 470.

Hook ends 482 of springs 480 are attached into apertures 424 of sliding bracket 410 and the other hook ends 484 of springs 480 are attached to posts 474 (block 910). Latch 390 is attached to cover 350 (block 912). Cover 350 is mounted to base 310 using fasteners 364 (block 914). Method 900 concludes at the end block.

In the above described flow chart, one or more of the methods may be embodied in a computer readable medium containing computer readable code such that a series of functional processes are performed when the computer readable code is executed on a computing device. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object oriented programming language, without limitation. These computer program instructions may be provided to a processor of a general purpose computer, special purpose computer, such as a service processor, or other programmable data processing apparatus to produce a machine, such that the instructions, which execute via the processor of the computer or other programmable data processing apparatus, performs the method for implementing the functions/acts specified in the flowchart and/or block diagram block or blocks.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

As will be further appreciated, the processes in embodiments of the present disclosure may be implemented using any combination of software, firmware or hardware. Accordingly, aspects of the present disclosure may take the form of an entirely hardware embodiment or an embodiment combining software (including firmware, resident software, micro-code, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. An information handling system having an electronic module (EM) carrier, the information handling system comprising:
    a pair of sliding brackets coupled to the EM carrier; and
    a pair of handles, each respectively coupled to a sliding bracket, each assembly of handle and sliding bracket being configured to:
        engage with a stationary chassis to hold the EM carrier at a first position in a bay of the stationary chassis when the handle is open; and
        translate the EM carrier to a second position in the stationary chassis when the handle is moved from an open position towards a closed position, wherein, in the second position, an EM carrier connector of the EM carrier is engaged with a sled connector of a sled, and, in the first position, the EM carrier connector is disengaged from the sled connector.

2. The information handling system of claim 1, wherein the sliding bracket is further configured to bias the EM carrier towards the sled when the handle is closed.

3. The information handling system of claim 1, further comprising:
    at least one spring coupled between the sliding bracket and the EM carrier, the at least one spring biasing the EM carrier towards the sled and the spring further biasing the EM carrier connector to engage the sled connector.

4. The information handling system of claim 3, wherein the at least one spring biasing the EM carrier connector to engage the sled connector prevents disengagement of the EM carrier connector from the sled connector during vibration and enables a lower handle force to engage the EM carrier connector with the sled connector.

5. The information handling system of claim 1, further comprising:
    a plurality of slots located in the sliding bracket; and
    a plurality of guide fasteners extending through the plurality of slots and coupled to the EM carrier, the sliding bracket configured to move along the slots between the first position and the second position.

6. The information handling system of claim 1, further comprising:
    a cutout located in the sliding bracket;
    at least one aperture extending through the sliding bracket;
    at least one post extending from the EM carrier into the cutout; and
    at least one spring located in the cutout and having a first end coupled to the sliding bracket through the aperture and a second end coupled to the post.

7. The information handling system of claim 1, wherein the handle further comprises:
    a pin moveably coupling the handle to the sliding bracket, the pin enabling the handle to rotate relative to the sliding bracket; and
    a cam coupled to a first end of the handle the cam having a pawl extending therefrom, the pawl configured to engage a rib on the stationary chassis when the handle is moved from the first position towards the second position.

8. The information handling system of claim 1, further comprising:
    a latch coupled to the EM carrier, the latch including a pair of rocker arms, springs, and a button, the latch configured to engage with a second end of each of the pair of handles when a corresponding handle is closed.

9. The information handling system of claim 1, wherein the EM carrier further comprises:
    a base;
    a printed circuit board connected to the base and coupled to the EM carrier connector; and
    a cover coupled to the base, the cover having at least one post extending from the cover towards the sliding bracket.

10. An electronic module (EM) carrier comprising:
    a pair of sliding brackets coupled to the EM carrier; and
    a pair of handles, each coupled to one sliding bracket, an assembly of each handle and sliding bracket being configured to:
        engage with a stationary chassis to hold the EM carrier at a first position in a bay of the stationary chassis when the handle is open; and
        translate the EM carrier to a second position in the stationary chassis when the handle is moved from an open position towards a closed position, wherein, in the second position, an EM carrier connector of the EM carrier is engaged with a sled connector of a sled, and, in the first position, the EM carrier connector is disengaged from the sled connector.

11. The EM carrier of claim 10, wherein the sliding bracket is further configured to bias the EM carrier the sled when the handle is closed.

12. The EM carrier of claim 10, further comprising:
at least one spring coupled between the sliding bracket and the EM carrier, the at least one spring biasing the EM carrier towards the sled and the spring further biasing the EM carrier connector to engage the sled connector.

13. The EM carrier of claim 12, wherein the at least one spring biasing the EM carrier connector to engage the sled connector prevents disengagement of the EM carrier connector from the sled connector during vibration and enables a lower handle force to engage the EM carrier connector with the sled connector.

14. The EM carrier of claim 10, further comprising:
a plurality of slots located in the sliding bracket; and
a plurality of guide fasteners extending through the plurality of slots and coupled to the EM carrier, the sliding bracket configured to move along the slots between the first position and the second position.

15. The EM carrier of claim 10, further comprising:
a cutout located in the sliding bracket;
at least one aperture extending through the sliding bracket;
at least one post extending from the EM carrier into the cutout; and
at least one spring located in the cutout and having a first end coupled to the sliding bracket through the aperture and a second end coupled to the post.

16. The EM carrier of claim 10, wherein the handle further comprises:
a pin moveably coupling the handle to the sliding bracket, the pin enabling the handle to rotate relative to the sliding bracket; and
a cam coupled to a first end of the handle the cam having a pawl extending therefrom, the pawl configured to engage a rib on the stationary chassis when the handle is moved from the first position towards the second position.

17. The EM carrier of claim 10, further comprising:
a latch coupled to the EM carrier, the latch including a pair of rocker arms, springs, and a button, the latch configured to engage with a second end of each of the pair of handles when a corresponding one of the pair of handles is closed.

18. The EM carrier of claim 10, further comprising:
a base;
a printed circuit board connected to the base and coupled to the EM carrier connector; and
a cover coupled to the base, the cover having at least one post extending from the cover towards the sliding bracket.

19. A method of manufacturing an electronic module (EM) carrier, the method comprising:
providing a pair of sliding brackets, a cover, a base, a pair of handles each having a first end and a second end with an attached cam, and a plurality of springs;
attaching the second end of each of the pair of handles to a sliding bracket, each handle configured to rotate relative to the sliding bracket;
coupling the sliding bracket to the cover via a plurality of guide fasteners such that that the sliding bracket can move about the guide fasteners parallel to the cover;
attaching first ends of the plurality of springs to the sliding bracket and second ends of the plurality of springs to the cover; and
mounting the cover to the base.

20. The method of claim 19, wherein the EM carrier is configured to:
engage with a stationary chassis to hold the EM carrier in the stationary chassis at a first position when the handle is open, the EM carrier being located in a bay of the stationary chassis in the first position;
translate the EM carrier relative to the stationary chassis to a second position when the handle is moved from the first position towards a second position where the handle is closed, wherein, in the second position, an EM carrier connector of the EM carrier is engaged with a sled connector of a sled, and, in the first position, the EM carrier connector is disengaged from the sled connector; and
bias, via the springs, the EM carrier towards the sled when the handle is closed.

* * * * *